US008102044B2

(12) United States Patent
Ruby et al.

(10) Patent No.: US 8,102,044 B2

(45) Date of Patent: Jan. 24, 2012

(54) BONDED WAFER STRUCTURE AND METHOD OF FABRICATION

(75) Inventors: Richard C. Ruby, Menlo Park, CA (US); James P. Roland, Fort Collins, CO (US); Frank S. Geefay, Cupertino, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 674 days.

(21) Appl. No.: 12/254,536

(22) Filed: Oct. 20, 2008

(65) Prior Publication Data

US 2010/0096745 A1 Apr. 22, 2010

(51) Int. Cl.
*H01L 23/12* (2006.01)
*H01L 21/00* (2006.01)

(52) U.S. Cl. .......................................................... 257/701

(58) Field of Classification Search .......... 257/618–628, 257/701, 685, 686, 723, 726, E25.031–E25.032, 257/100, 433, 434, 667, 787–796, E31.117–E31.118, 257/E51.02, E23.116–E23.14, E21.502–E21.504, 257/772, 779, E23.02, E23.023–E23.079; 438/6, 28, 64–67, 107, 109, 406, 455–459, 15, 25, 26, 51, 55, 112, 124

See application file for complete search history.

(56) References Cited

U.S. PATENT DOCUMENTS

| | | | |
|---|---|---|---|
| 4,882,245 A | 11/1989 | Gelorme et al. | |
| 6,228,675 B1 | 5/2001 | Ruby et al. | |
| 6,265,246 B1 | 7/2001 | Ruby et al. | |
| 6,376,280 B1 | 4/2002 | Ruby et al. | |
| 6,429,511 B2 | 8/2002 | Ruby et al. | |
| 6,794,958 B2 | 9/2004 | Philliber et al. | |
| 2007/0205502 A1* | 9/2007 | Liu et al. | 257/712 |
| 2007/0231943 A1* | 10/2007 | Ouellet et al. | 438/50 |
| 2007/0295456 A1* | 12/2007 | Gudeman et al. | 156/379.7 |

* cited by examiner

*Primary Examiner* — Dao H Nguyen
*Assistant Examiner* — Tram H Nguyen

(57) ABSTRACT

A method of packaging electronics comprises providing a first wafer and providing a second wafer. The method also comprises depositing a polymer material over a surface of the first wafer; and selectively removing a portion of the polymer from the first wafer to create a void in the polymer. The method also comprises placing the first wafer over the second wafer and in contact with the polymer; and curing the polymer to bond the first wafer to the second wafer. A bonded wafer structure is also described.

15 Claims, 4 Drawing Sheets

300
304
315
308
316
309
301
307
306
303
302
310
313
311
317
312
313
314
305
314

BONDED WAFER STRUCTURE AND METHOD OF FABRICATION

BACKGROUND

In many electronic packages, materials such as ceramic materials are used for packaging. These materials have certain benefits, but also have drawbacks. One drawback is the ultimate price of the package due to the intrinsic cost of the ceramic materials. Also, known ceramic packages increase the overall volume of the package because the package includes a base, walls and a lid that encase the devices and circuitry. Furthermore, and of particular concern in high-frequency applications, ceramic packages often have parasitic inductances and capacitances that either degrade the performances of the devices and circuits, or must be mitigated, or both. The degradation can serve to defeat the overall performance of the device, and the mitigation of parasitics can be complicated or can add to the overall cost of the package, or both.

While some alternatives to known ceramic packaging methods have been explored, there remains a need to reduce the complexity of the method, or the cost of the final product and, at the same time, providing packaging useful in high-frequency applications. There is a need, therefore, for packaging method that overcomes at least the shortcoming of known methods and packages discussed above.

SUMMARY

In accordance with a representative embodiment, a method of packaging electronics comprises providing a first wafer and providing a second wafer. The method also comprises depositing a polymer material over a surface of the first wafer; and selectively removing a portion of the polymer from the first wafer to create a void in the polymer. The method also comprises placing the first wafer over the second wafer and in contact with the polymer; applying pressure at a temperature to bond the wafers together; and curing the polymer to further bond the first wafer to the second wafer.

In accordance with another representative embodiment, a bonded wafer structure comprises a first wafer comprising an inner surface and an outer surface and a second wafer comprising an inner surface and an outer surface. The structure also comprises a cured polymer disposed between the first wafer and the second wafer and a void in the cured polymer extending from the inner surface of the first wafer to the inner surface of the second wafer. A first electronic component is disposed over either the inner surface of the first wafer or the inner surface of the second wafer and in the void; and a second electronic component is disposed over the same surface as the first electronic component and substantially sealed by the cured polymer.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

As used herein, the terms 'a' or 'an', as used herein are defined as one or more than one.

In addition to their ordinary meanings, the terms 'substantial' or 'substantially' mean to with acceptable limits or degree to one having ordinary skill in the art. For example, 'substantially cancelled' means that one skilled in the art would consider the cancellation to be acceptable.

In addition to their ordinary meanings, the terms 'approximately' mean to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the representative embodiments. Nonetheless, such devices, materials and methods that are within the purview of one of ordinary skill in the art may be used in accordance with the representative embodiments.

Figure 1A:
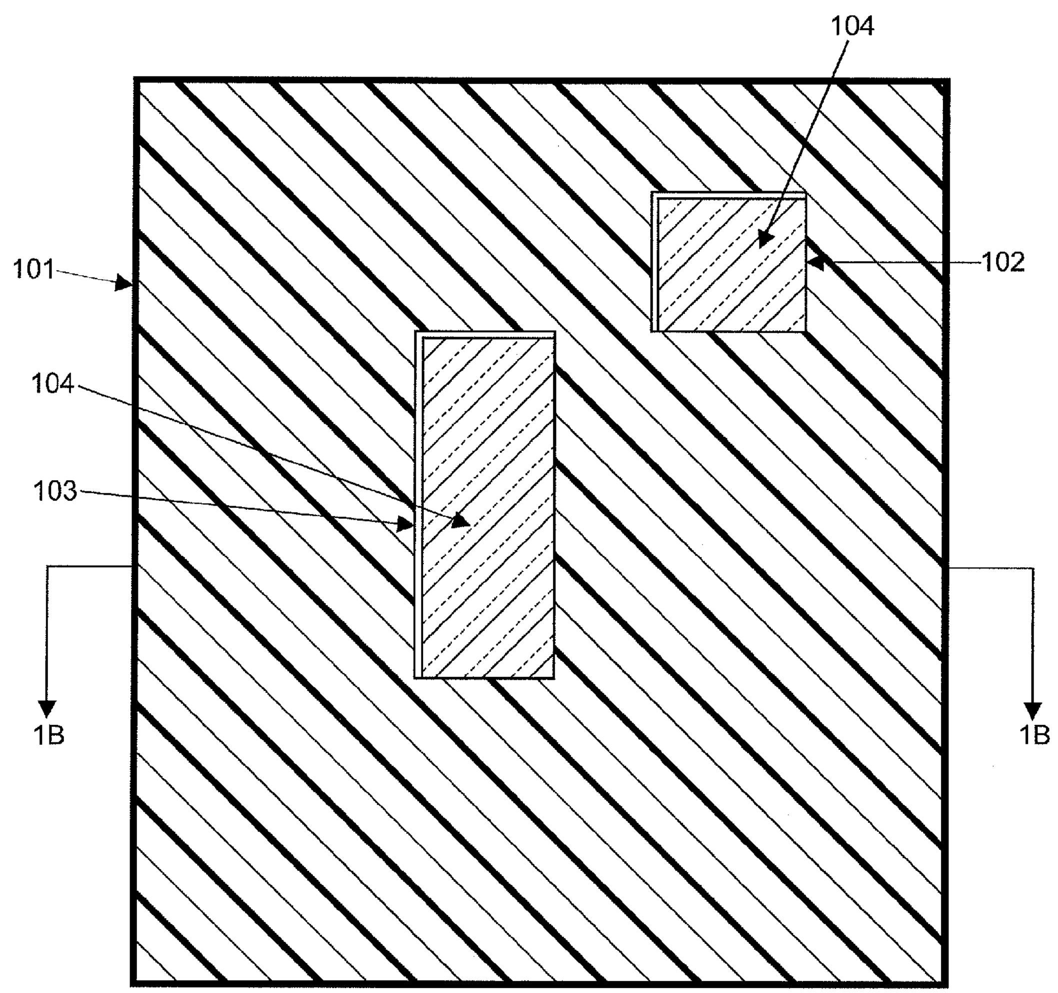
FIG. 1A shows a top-view of a wafer in accordance with a representative embodiment.

FIG. 1A shows a top-view of a wafer in accordance with a representative embodiment. The wafer comprises a polymer 101 has a first void 103 and a second void 102, which extend to an inner surface 104 of the wafer. As described more fully herein, electronic components (not shown in FIG. 1A) may be provided in the voids during processing by one of a number of methods.

Figure 1B:
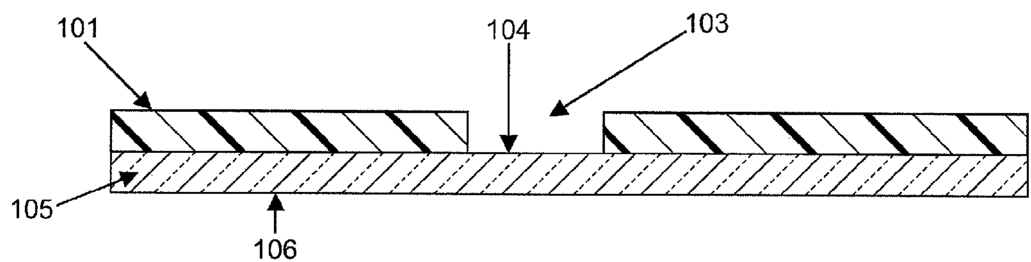
FIG. 1B shows a cross-sectional view of the wafer of FIG. 1A.

FIG. 1B shows a cross-sectional view of the wafer 105 of FIG. 1A. The wafer 105 may comprise the substrate and further comprise passive and active electronic components (not shown in FIG. 1B) disposed over the inner surface 104 or on the outer surface 106, or both. The electronic components may be integrally fabricated from the wafer 105, or may be fabricated over the wafer, or both. For example, the wafer may be a III-V semiconductor (e.g., comprising GaAs) and may comprise active and passive devices formed from the semiconductor. It is emphasized that the wafer may be other than a III-V semiconductor; for example other semiconductor materials, including materials comprising silicon may be used. For instance, the use of materials comprising Si, SiGe, SiC and silicon on insulator (SOI) are contemplated.

Moreover, in some embodiments the wafer 105 may be a non-semiconductor material such as a glass material or a liquid crystal polymer material. As described more fully herein, the use of non-semiconductor materials for the wafer comprise embodiments where the wafer 105 is a 'lid.' In such embodiments, the wafer materials are selected for, among other reasons, their comparatively reduced dielectric constant (relative permittivity, $\epsilon_r$). As should be appreciated by one having ordinary skill in the art, active electronic devices in general will not be provided over or in a lid comprising other than semiconductor materials. However, passive components may be provided on inner or outer surfaces (e.g., 104, 106) of a non-semiconductor (e.g., a glass material) wafer, with electrical connections (not shown) provided with vias and other known connection techniques.

Notably, and as will be described more fully herein, the electronic components may be disposed over the surface 104 and sealed in the polymer 101 or provided in a void 102, 103, or both. The polymer 101 seals the electronic components provided therein from potentially contaminating elements of the environment. For example, the polymer 104, when cured will prevent particulates from settling on the electronic components. Generally, the polymer materials selected provide some protection against moisture, but do not provide a hermetic seal. This is not a preclusion of materials: other materials known or to be discovered may provide the requisite electrical and mechanical properties for a bonded wafer structure, while also providing hermetic sealing.

The electronic components sealed in polymer 104 are usefully inert to the polymer. To this end, the electrical properties of the electronic components sealed in the polymer 101 cannot be substantially adversely impacted by contact with or close proximity to the polymer 101. For example, the electronic components sealed in the polymer 101 would not substantially capacitively couple to the polymer or would have their electrical performance impacted by the polymer. Illustratively, certain passive components (e.g., chip capacitors and inductors) and select electrical traces may be sealed in the polymer; as may be active devices having electrical characteristics not adversely impacted by the polymer.

By contrast, electronic components that would be adversely impacted by contact with or close proximity to the polymer 101 are provided in voids 102, 103. These electronic components include, but are not limited to active devices or devices that would experience a change in their electrical characteristics due to the presence of the polymer 101. For example, because the devices are surrounded by a material having a dielectric constant that is greater than air, capacitive coupling may occur. Thus, devices that are commonly operated at high frequencies (e.g., GHz frequencies and higher) may experience capacitive coupling. This can have an unexpected if not deleterious impact on the performance of these devices. As such, these devices are provided in voids (e.g., 102, 103) in the polymer 101.

Other devices may be disposed in voids 102, 103 to avoid altering their electrical characteristics. For example, acoustic resonator devices, such as film bulk acoustic resonators (FBARs) may be disposed in voids so that their resonance characteristics and electrical characteristics are not adversely impacted. To this end, placing material over an FBAR can impact its functionality. Thus, it is useful to place FBARs in voids 102, 103 in the polymer. Still other devices are contemplated for placement in the voids.

The polymer 101 may be one of a variety of polymer materials selected to provide sealing of electronic components while enabling adhering of wafers together. Notably, the polymer materials may be cured by a thermal process suitable for their particular composition. This curing not only adheres the wafers together, but also provides structural rigidity to the bonded wafers. As to the latter, because the polymer is provided over a comparatively large portion of the overlapping wafer area, upon curing, substantial support is provided. Among other benefits, and as will become clearer as the present description continues the heightened support provided by the cured polymer allows for a relaxation of the structural rigidity requirements of the wafers. This relaxation allows for the selection of less rigid materials for one or more of the wafers, allowing for example, selection of materials with more advantageous electrical or environmentally protective properties; or for the use of wafers having a reduced thickness.

In representative embodiments, the polymer 101 is one of a patternable polymer, an etchable polymer or a polymer film. Common to all polymers useful in representative embodiments, among other traits, are their compatibility to processing to form voids 102, 103; their structural strength when cured; their adhesive properties; and their compatibility with semiconductor materials and processing. Patternable and etchable polymers are provided over the inner surface 104 of the wafer 105 by known methods such as known spin on methods. Patternable polymers are exposed and developed according to known techniques, and after developing, the desired pattern remains. Etchable polymers have a photomask formed thereover, and after patterning the photomask, the unprotected polymer is etched to reveal the voids in desired locations. Polymer films are a class of polymer materials that are provided in sheets and are vacuum attached to the inner surface 104 of the wafer 105. The polymer films can then be etched or exposed and developed to reveal the voids.

As the methods of patterning the polymers are known generally to one of ordinary skill in the art, details thereof are not provided to avoid obscuring the description of the representative embodiments. Furthermore, and while in no way limiting of the choice of polymer material, polymers comprising benzocyclobutene (BCB) or comprising SU-8 are contemplated for use in representative embodiments. As is known, SU-8 is a photosensitive material commonly used in microelectromechanical (MEM) applications is described in, for instance, U.S. Pat. No. 4,882,245, the disclosure of which is specifically incorporated herein by reference.

Figure 2:
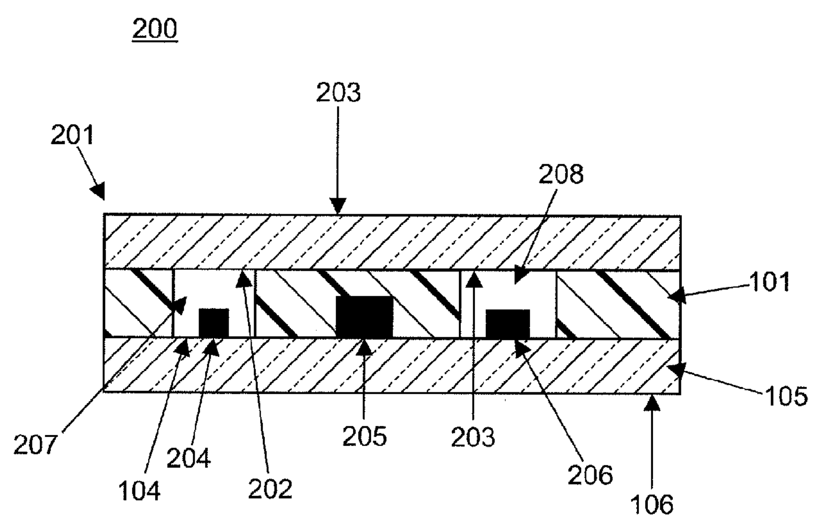
FIG. 2 shows a cross-sectional view of bonded wafers in accordance with a representative embodiment.

FIG. 2 shows a cross-sectional view of a bonded wafer structure 200 in accordance with a representative embodiment. The bonded wafer structure 200 includes many features common to those described in connection with the embodiments of FIGS. 1A and 1B. Many of these details are not repeated so as to avoid obscuring the description of the representative embodiments. A first wafer 201 comprises an inner surface 202 and an outer surface 203. The second wafer 105 comprises inner surface 104 and outer surface 106. Polymer 101 is disposed between the inner surfaces 202 or 104 and bonds the wafers 104, 201 together as described above.

The representative embodiment shows electronic components 204, 205, 206. These components are shown disposed over the inner surface 104 of wafer 105. This depiction is, to some extent, figurative. To this end, the components 204-206 may be one of a variety of electrical devices/circuits that may comprise components in the wafer and over the wafer; or devices/circuits solely in the wafer; or solely over the wafer. For example, one or more of the components may be a field effect transistor (e.g., a MESFET or MOSFET) having a components (e.g., channel) formed in the wafer 105 and components (e.g., gate and contacts) formed over the wafer 104. By contrast, devices such as high electron mobility transistors (HEMT and pHEMT) have most components in the wafer; whereas chip capacitors and inductors are usually provided only over the wafer. As such, when referring to an electronic component as being disposed 'over' a surface of a wafer, it is meant herein, that the component can be in the wafer, on or over the wafer, or a combination of in and on or over the wafer.

As shown, components 204 and 206 are disposed over surface 204 and provided in voids 207 and 208, respectively. Electrical component 205 is provided over surface 104 and is sealed in polymer 101. As described briefly above, the polymer 101 may be provided over one or the other inner surfaces 104, 202 of wafers 105, 201, respectively, and processed to form the voids. After forming the voids 207, 208 is complete, the wafer having the processed polymer is placed in contact with the other wafer with the polymer 101 contacting the inner surface of the other wafer. In a representative embodiment, no electronic components are provided over the second wafer 201 and the polymer 101 is provided over second wafer 201. The polymer 101 is processed to form the voids 207, 208, and the second wafer 201 is placed over the first wafer 105 so that the polymer contacts the inner surface 104, encapsulates component 205 and is aligned so that components 204, 206 are located in voids 207, 208. In such an arrangement, and as alluded to above, the second wafer 201 may be referred to as the lid.

Alternatively, after formation or placement of components 204-206, the polymer 101 may be provided over the inner surface 104 of the first wafer 105, processed to form voids 207, 208. Thereafter, the second wafer 201 is placed over the first wafer 105 so that the polymer 101 contacts the inner surface 202. Again the second wafer 201 may be referred to as the lid. Care must be taken to ensure that components 204, 206 are inert to the materials (e.g., developer or etchant) used to process the polymer 101.

Regardless of the sequence selected, once the wafers are disposed over one another as shown in FIG. 2, the polymer is cured as needed. Normally, this is effected by heating in a selected ambient the wafer structure 200 until the curing step is completed. The method steps used to cure the polymer are both polymer specific and known to one of ordinary skill in the art and are not repeated to avoid obscuring the description of the representative embodiments. After the polymer is cured, the wafer 105, 201 are bonded to one another and provide a seal of the components 204-206 provided therein. The wafers 105, 201 may be selectively thinned and diced into individual die for further packaging or direct bonding in a circuit, for example. As noted previously, the cured polymer used to bond the wafers 105, 201 provides structural strength that allows for the wafers 105, 201 to be comparatively thin, which can be beneficial in many electronic applications.

Figure 3:
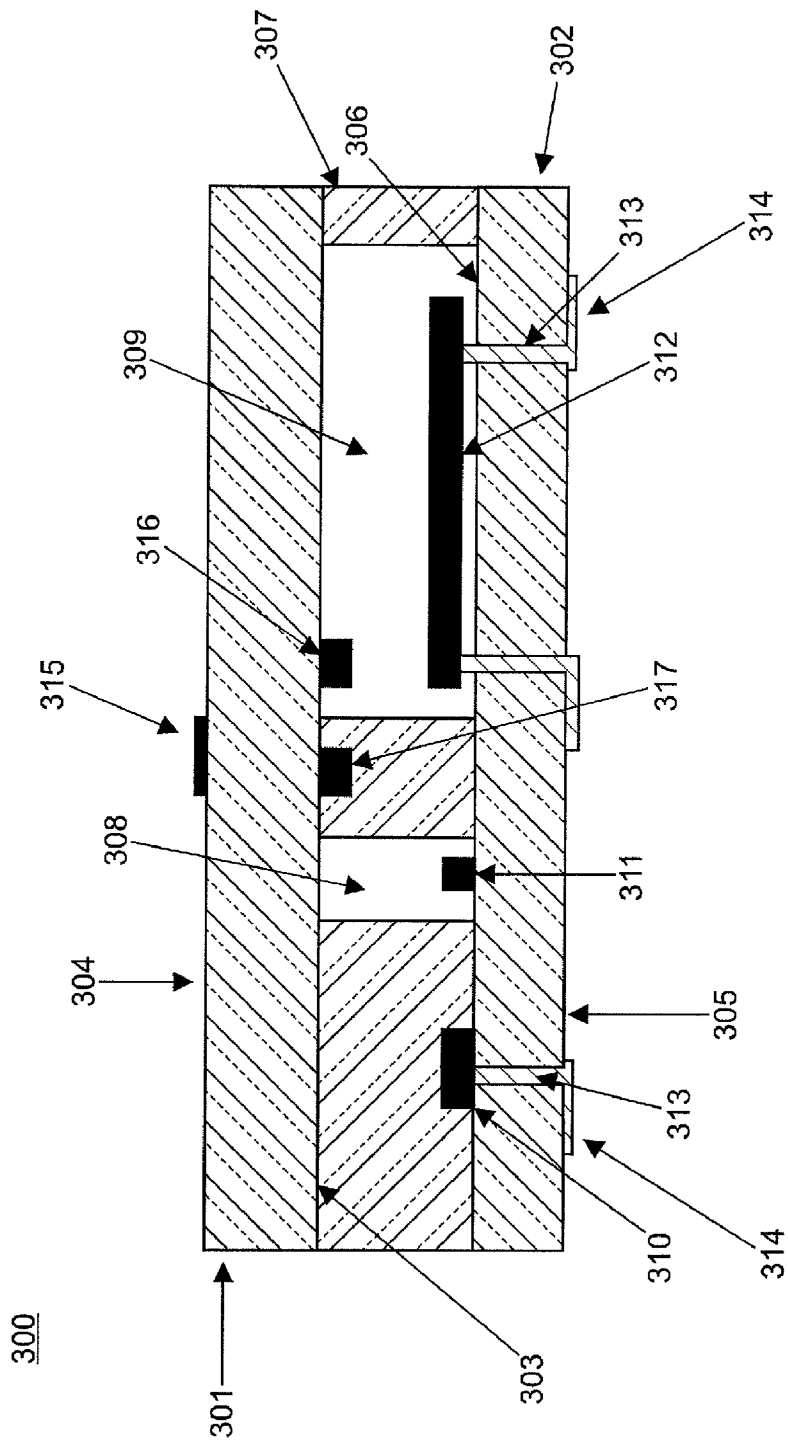
FIG. 3 shows a cross-sectional view of a bonded wafer structure in accordance with a representative embodiment.

FIG. 3 shows a cross-sectional view of a bonded wafer structure 300 in accordance with a representative embodiment. The bonded wafer structure 300 includes many features common to those described in connection with the embodiments of FIGS. 1A through 2. Many of these details are not repeated so as to avoid obscuring the description of the representative embodiments. A first wafer 301 is disposed over a second wafer 302. The first wafer 301 comprises an inner surface 303 and an outer surface 304. The second wafer 302 comprises and inner surface 306 and an outer surface 305. A polymer layer 307 bonds the first and second wafers 301, 302 together by their inner surfaces 303, 306, respectively. The polymer layer 307 is cured as required.

An electronic component 310, which is provided over the inner surface 306 of the second wafer 302, is sealed in the polymer 307 as shown. The structure 300 also comprises a void 308 in which an electronic component 311 is disposed. As shown, the component is provided over the inner surface 306 of the second wafer 302. An air gap 309, which is formed in substantially the same manner as the void 308, is provided between the first and second wafers 301, 302. The air gap 309 includes an electronic device 312 disposed over the inner surface 306 of the second wafer 302 as shown; and is connected to electrical contacts 314 over the outer surface 305 of the second wafer 302 by conductive vias 313 through the second wafer 302. The air gap 309 comprises many features described in one or more of U.S. Pat. Nos. 6,794,958; 6,429,511; 6,376,820; 6,265,246; 6,228,675 to Richard C. Ruby, et al. The disclosures of these patents are specifically incorporated herein by reference.

In one embodiment, the air gap 309 is provided so that the surrounding environment to the component 312 is air, thereby forming an 'air bridge'. As described briefly above, certain electronic components can suffer from electrical performance degradation (e.g., due to capacitive coupling) if the dielectric constant of its surrounding environment is greater than 1.0 (i.e., air) or if the device is in close proximity to materials having a dielectric constant that is significantly greater than air. In one representative embodiment, the first wafer 301 comprises a material having a dielectric constant that is significantly less than many common wafers. For example, in representative embodiments, the first wafer 301 may comprise a glass material having a dielectric constant that is approximately 4. By contrast, a wafer comprising GaAs has a dielectric constant of approximately 13; and a wafer comprising silicon has a dielectric constant of approximately 12 (of course, the dielectric constant is dependent on frequency but these values are fair approximations). Thus, capacitive coupling can be significantly reduced by selecting the glass material for the first wafer 301. Moreover, the selection of a glass material for the first wafer 301 allows the distance between the wafers 301, 302 to be reduced because capacitive coupling has been reduced. As such, the overall thickness of the wafer structure 300 can be reduced. Furthermore, at present, glass materials can be obtained at a much reduced cost compared to GaAs for example. In the end, the structure 300 can be made smaller (less voluminous) and cheaper than its counterparts in GaAs or Si.

In certain embodiments, the electronic component 312 may comprise an FBAR resonator and attendant circuits. In many instances, a cavity or recess (a 'swimming pool') is provided beneath the FBAR device. Once fabricated, collection of other materials therein may adversely impact the function of the FBAR. Thus, if polymer were to collect in the cavity, the FBAR performance could be degraded. As such, it is beneficial to process the polymer 307 to form the void 308 and the air gap 309 over the first wafer 301; separately form the FBAR and cavity over the second wafer 302; aligning the first wafer 301 over the second wafer; and bond the first wafer 301 to the second wafer 302 by applying an appropriate pressure and temperature to the polymer as describer above and cured.

The first wafer 301 may comprise electronic components as well. For example, the first wafer 301 may comprise an electronic component 315 disposed over the outer surface 304. This may be a passive electrical device or circuitry. In some embodiments, placement of certain electrical devices away from others that may be contained between the wafers 301, 302 may be beneficial in preventing deleterious effects such as capacitive coupling. These components may be located away outside the wafers in order to save space. Alternatively, or additionally, electronic component 316 and electronic component 317 may be disposed over the inner surface 303. As shown, component 316 is disposed in the air gap 309 and component 317 is sealed in polymer 307. Connections to and from component 316 may be by methods described in the patents to Ruby, et al.

Figure 4:
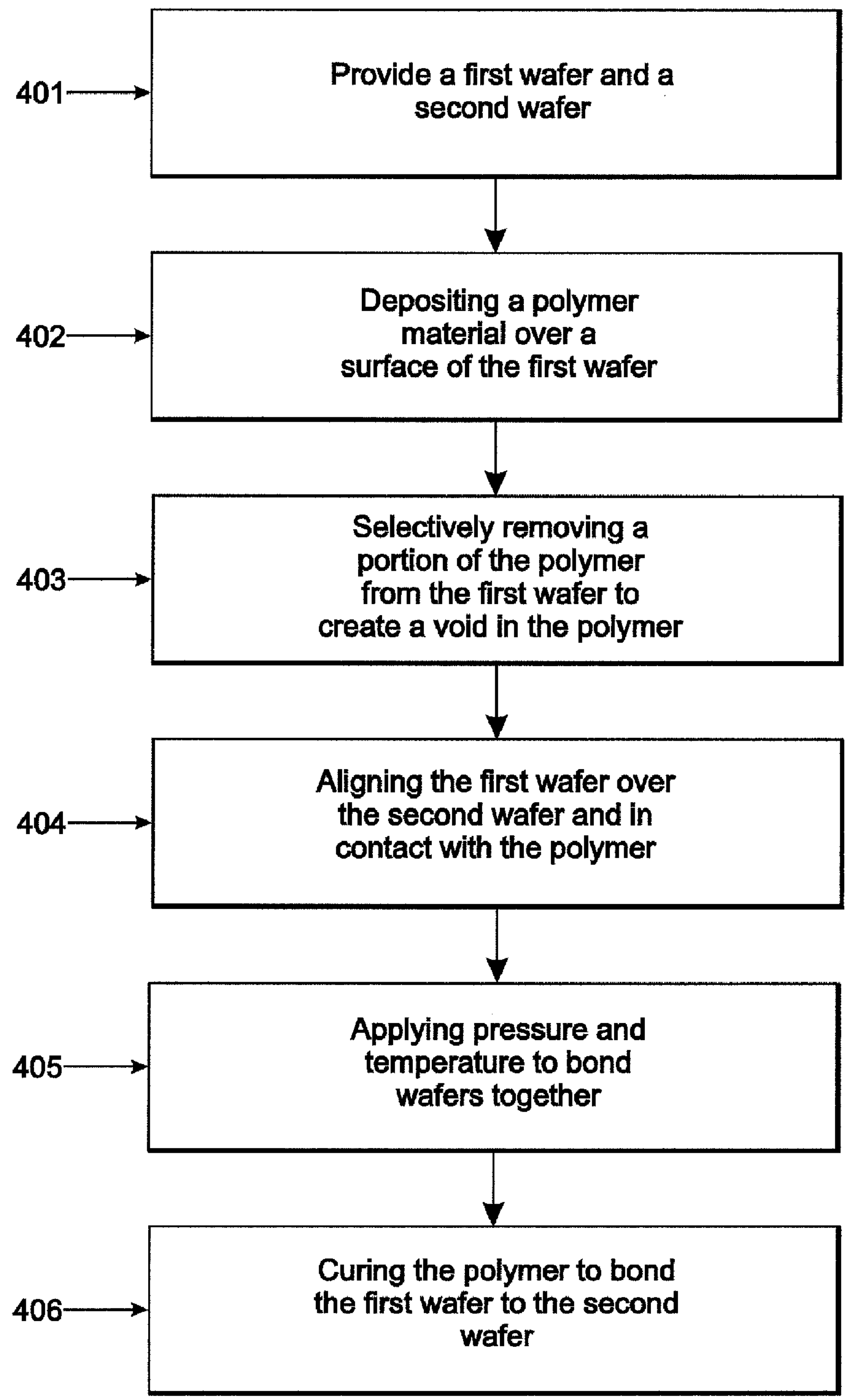
FIG. 4 shows a flow-chart of a method of packaging in accordance with a representative embodiment.

FIG. 4 shows a flow-chart of a method of packaging electronics in accordance with a representative embodiment. The processing sequences and materials of the method are described in connection with representative embodiments in conjunction with FIGS. 1A through 3. The details of the processing sequences and materials are not repeated so as to avoid obscuring the description of the representative embodiments. The method comprises at 401 providing a first wafer and providing a second wafer. At 402 the method comprises depositing a polymer material over a surface of the first or second wafer. At 403 the method comprises selectively removing a portion of the polymer to create a void in the polymer. At 404, the method comprises aligning and placing the polymer coated wafer over the uncoated wafer and in contact with the polymer. At 405 the method comprises applying suitable pressure and temperature to bond the polymer of the coated wafer to the uncoated wafer. At 406, the method comprises curing the polymer to better bond the first wafer to the second wafer as needed.

In view of this disclosure it is noted that the bonded wafer structure and methods of bonding wafers described herein can be implemented in a variety of materials, variant structures, configurations and topologies. Moreover, applications other than wafer-to-wafer bonding may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A method of packaging electronics, the method comprising:

providing a first wafer;

providing a second wafer;

depositing a polymer material over a surface of the first wafer; selectively removing a portion of the polymer from the first wafer to create a void in the polymer;

placing the first wafer over the second wafer and in contact with the polymer; applying a pressure at a temperature to bond the first wafer to the second wafer; and curing the polymer to bond the first wafer to the second wafer, wherein the first wafer comprises a first electronic component and a second electronic component and the first electronic component is substantially sealed by the polymer.

2. A method as claimed in claim 1, wherein the second electronic component is disposed in the void.

3. A method as claimed in claim 2, wherein the selectively removing further comprises exposing a portion of the surface of the first wafer.

4. A method as claimed in claim 3, wherein the selectively removing further comprises exposing a portion of the surface of the first wafer and the second electronic component is disposed in the void.

5. A method as claimed in claim 1, wherein the first wafer and the second wafer each comprise gallium arsenide.

6. A method as claimed in claim 1, wherein the first wafer comprises a glass material.

7. A method as claimed in claim 1, wherein the first wafer comprises a liquid crystal polymer.

8. A method as claimed in claim 1, wherein the polymer comprises one of:

a patternable polymer; an etchable polymer; or a polymer film.

9. A method as claimed in claim 1, further comprising, after the curing dicing the bonded wafers to form at least one die.

10. A bonded wafer structure, comprising:

a first wafer comprising an inner surface and an outer surface;

a second wafer comprising an inner surface and an outer surface;

a cured polymer disposed between the first wafer and the second wafer;

a void in the cured polymer extending from the inner surface of the first wafer to the inner surface of the second wafer;

a first electronic component disposed over either the inner surface of the first wafer or the inner surface of the second wafer and in the void; and a second electronic component disposed over the same surface as the first electronic component and substantially sealed by the cured polymer.

11. A bonded wafer structure as claimed in claim 10, wherein the first wafer and the second wafer each comprise gallium arsenide.

12. A bonded wafer structure as claimed in claim 10, wherein the first and second electronic components are both disposed over the first wafer and the second wafer comprises a glass material.

13. A bonded wafer structure as claimed in claim 12, wherein the first wafer comprises gallium arsenide.

14. A bonded wafer structure as claimed in claim 12, further comprising a third electronic component disposed over either the inner surface or the outer surface of the second wafer.

15. A method of packaging electronics, the method comprising:

providing a first wafer;

providing a second wafer;

depositing a polymer material over a surface of the first wafer; selectively removing a portion of the polymer from the first wafer to create a void in the polymer;

placing the first wafer over the second wafer and in contact with the polymer;

applying a pressure at a temperature to bond the first wafer to the second wafer; and curing the polymer to bond the first wafer to the second wafer, wherein the second wafer comprises a first electronic component disposed over the surface and a second electronic component disposed over the surface, and the first electronic component is substantially encapsulated in the polymer when the first wafer is placed over the second wafer.

* * * * *